US012582017B2

(12) United States Patent
Lefevre et al.

(10) Patent No.: US 12,582,017 B2
(45) Date of Patent: Mar. 17, 2026

(54) BONDING LAYER AND PROCESS

(71) Applicant: Tokyo Electron Limited, Tokyo (JP)

(72) Inventors: Scott Lefevre, Albany, NY (US); Adam Gildea, Albany, NY (US); Satohiko Hoshino, Koshi (JP); Sophia Madelone, Albany, NY (US); Yuji Mimura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 377 days.

(21) Appl. No.: 18/320,791

(22) Filed: May 19, 2023

(65) Prior Publication Data

US 2024/0234363 A1 Jul. 11, 2024

Related U.S. Application Data

(60) Provisional application No. 63/438,362, filed on Jan. 31, 2023.

(51) Int. Cl.
H01L 23/00 (2006.01)

(52) U.S. Cl.
CPC .............. H01L 24/80 (2013.01); H01L 24/08 (2013.01); H01L 2224/08145 (2013.01); H01L 2224/80379 (2013.01); H01L 2224/80895 (2013.01); H01L 2224/80896 (2013.01)

(58) Field of Classification Search
CPC ...................... H01L 24/80; H01L 24/08; H01L 2224/08145; H01L 2224/80379; H01L 2224/80895; H01L 24/05
See application file for complete search history.

(56) References Cited

U.S. PATENT DOCUMENTS

| | | | |
|---|---|---|---|
| 10,259,907 B2 | 4/2019 | Vora et al. | |
| 2014/0275555 A1* | 9/2014 | Johnson | C07D 403/14 |
| | | | 548/255 |
| 2017/0352543 A1 | 12/2017 | Park et al. | |
| 2018/0033988 A1 | 2/2018 | Walter et al. | |
| 2020/0066927 A1 | 2/2020 | Greer et al. | |
| 2022/0379582 A1* | 12/2022 | Sorelle | B01L 3/502707 |
| 2022/0384176 A1 | 12/2022 | Bhuyan et al. | |

FOREIGN PATENT DOCUMENTS

WO    WO-2019066814 A1 *    4/2019    ....... H01L 23/49822

OTHER PUBLICATIONS

International Search Report and Written Opinion on PCT Matter PCT/US2023/035997 dated Feb. 19, 2024 (11 pages).

* cited by examiner

*Primary Examiner* — Mamadou L Diallo
(74) *Attorney, Agent, or Firm* — Foley & Lardner LLP

(57) ABSTRACT

A method includes providing a first substrate with a first surface including an alkyne moiety. The method includes providing a second substrate with a second surface including an azide moiety. The method further includes bonding the first substrate to the second substrate. The bonding of the first substrate to the second substrate includes making physical contact between the first surface and the second surface at an interface and chemically reacting the alkyne moiety with the azide moiety through a cycloaddition mechanism, thereby forming a triazole moiety-linked layer at the interface.

16 Claims, 23 Drawing Sheets

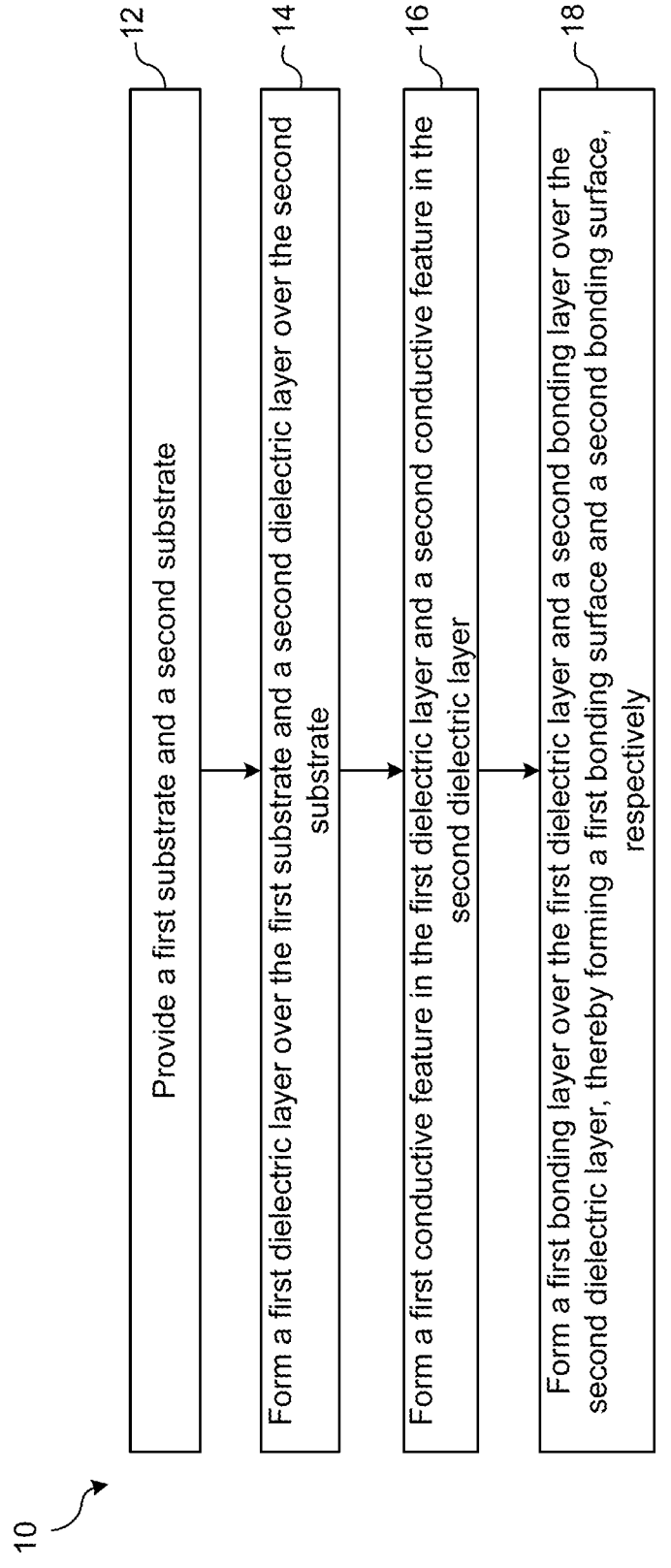

10

12

Provide a first substrate and a second substrate

14

Form a first dielectric layer over the first substrate and a second dielectric layer over the second substrate

16

Form a first conductive feature in the first dielectric layer and a second conductive feature in the second dielectric layer

18

Form a first bonding layer over the first dielectric layer and a second bonding layer over the second dielectric layer, thereby forming a first bonding surface and a second bonding surface, respectively

BONDING LAYER AND PROCESS

CROSS-REFERENCE TO RELATED APPLICATION

The present application claims priority to U.S. Provisional Application No. 63/438,362, filed on Jan. 11, 2023, and titled "BONDING LAYER AND PROCESS," the entire disclosure of which is incorporated herein by reference for all purposes.

FIELD OF THE DISCLOSURE

This disclosure relates to methods of semiconductor manufacturing and more particularly to the bonding of multiple semiconductor substrates.

BACKGROUND

Wafer-to-wafer, chip-to-chip, and chip to wafer bonding (generally, substrate bonding) is being implemented to continue Power-Performance-Area-Cost (PPAC) scaling for complex circuits such as are implemented in Systems on Chip (SOCs). Many bonding techniques, such as direct and hybrid bonding, often utilize high pressure and/or temperature to achieve reliable oxide-to-oxide bonding adhesion between the substrates. Lower temperature bonding technologies with excellent adhesion are desired.

FIG. 1 illustrates some of the steps of a conventional process for bonding two semiconductor substrates (e.g., wafers) to form a semiconductor structure 100, though the process is abbreviated and simplified here as it is well known and merely for illustration purposes. A semiconductor substrate 101 includes a base substrate 102 and a plurality of active devices, metallization, and other circuitry features disposed within and/or over the base substrate 102. A dielectric layer 104 is formed over the base substrate 102. The conductive feature 106 may include copper (Cu). The conductive features 106 are formed at or below a bonding surface 108 of the dielectric layer 104. The bonding surface 108 is configured to engage and bond with another bonding surface 108 disposed over a different semiconductor substrate 101 to form the semiconductor structure 100. The dielectric layer 104 may include an oxide, a nitride, a carbide, the like, or combinations thereof, as is well known and described elsewhere. The conductive features 106 are often recessed to below the bonding surface 108 to ensure that, when two bonding surfaces are brought together, a strongly bonded dielectric-to-dielectric interface is formed prior to the conductive features 106 protruding and contacting each other across a bonding interface 110 therebetween. Referring to FIG. 1A, the bonding surface(s) 108 are activated using a plasma (e.g. such as an $N_2$ plasma and/or an $O_2$ plasma) to prepare the surfaces for bonding. Referring to FIG. 1B, hydration is often provided to further enhance the bonding capabilities of the bonding surface(s) 108. Referring to FIG. 1C, the bonding surfaces 108 of two semiconductor substrates 101 are aligned and brought into contact at the bonding interface 110. An anneal step, as shown in FIG. 1D, may improve the dielectric-to-dielectric bond and/or causes the conductive contacts to expand toward each other and create a physical and electrical contact as part of the semiconductor structure 100. One or both substrates may be thinned (not shown) as needed for a given application.

The existing bonding process can be complex and expensive to perform. Creating Si—O linkages (between two opposing dielectric layers) at the bonding interface may rely on the implementation of plasma activation as described in FIG. 1A, followed by treatment with water as described in FIG. 1B. In some instances, such treatment processes may suffer from queue time lag limitations. Moreover, the bonding interface may exhibit limited bonding strength and may be reversible using certain techniques, such as inserting a blade at the bonding interface. In some instances, the bonding strength may be weakened due to environment or processing issues. The hydration step (as shown in FIG. 1B) may also be problematic in that it may cause oxidation of copper-based conductive features, which increases their resistivity. Thus, alternative procedures for implementing a direct or hybrid bonding process without relying on activation and hydration processes are desired.

SUMMARY

Described herein are structures and techniques that provide for improved bonding between substrates. According to one implementation, a direct covalent bond is formed between two substrates, where a first substrate (or wafer) includes a first bonding surface having a first bonding layer that is functionalized with an azide-terminated moiety and a second substrate (or wafre) includes a second bonding surface having a second bonding layer that is functionalized with an alkyne-terminated moiety. When the bonding surfaces are brought into contact and a thermal treatment is applied, the moieties form a triazole linkage at an interface having a ring structure that is covalent in nature lending to a stronger bond across the interface.

In one aspect, the present disclosure provides a method that includes providing a first substrate with a first surface including an alkyne moiety. The method includes providing a second substrate with a second surface including an azide moiety. The method further includes bonding the first substrate to the second substrate. The bonding of the first substrate to the second substrate includes making physical contact between the first surface and the second surface at an interface and chemically reacting the alkyne moiety with the azide moiety through a cycloaddition mechanism, thereby forming a triazole moiety-linked layer at the interface.

In some implementations, the alkyne moiety is coupled to the first substrate via a first base molecule and the azide moiety is coupled to the second substrate via a second base molecule.

In some implementations, providing the first substrate includes applying a first self-assembled monolayer (SAM) over the first surface, where the first SAM includes the alkyne moiety extending from the first surface. In some implementations, providing the second substrate includes applying a second SAM over the second surface, where the second SAM includes the azide moiety extending from the second surface.

In some implementations, the first SAM and the second SAM are each applied using a selective deposition process. In some implementations, providing the first substrate further includes functionalizing the first surface before applying the first SAM and providing the second substrate further includes functionalizing the second surface before applying the second SAM. In some implementations, applying the first SAM and the second SAM include depositing each of the first SAM and the second SAM as a blanket layer and removing portions of the first SAM and the second SAM. In some implementations, the first surface includes a first conductive feature disposed in a first dielectric layer and the second surface includes a second conductive feature disposed in a second dielectric layer, where the first SAM and the second SAM are selectively formed over the first dielectric layer and the second dielectric layer, respectively.

In some implementations, bonding the first substrate to the second substrate includes applying a thermal treatment to activate the cycloaddition mechanism.

In another aspect, the present disclosure provides a method that includes providing a first substrate with a first bonding surface including an alkyne group. The method includes providing a second substrate with a second bonding surface including an azide group. The method includes bonding the first substrate to the second substrate by making physical contact between the bonded first bonding surface and second bonding surface. The method further includes performing a thermal treatment, thereby allowing a cycloaddition process to occur between the bonded first bonding surface and second bonding surface.

In some implementations, bonding the first substrate to the second substrate includes aligning the first bonding surface with the second bonding surface. In some implementations, the alkyne groups is linked to the first substrate by a first base molecule and azide groups is linked to the second substrate by a second base molecule.

In some implementations, providing the first substrate includes forming a first self-assembled monolayer (SAM) over the first bonding interface, where the first SAM includes the alkyne group, and providing the second substrate includes forming a second SAM over the second bonding surface, where the second SAM includes the azide group. In some implementations, providing the first substrate includes selectively depositing the first SAM over the first bonding surface and providing the second substrate includes selectively depositing the second SAM over the second bonding surface.

In some implementations, performing the thermal treatment causes the alkyne group to covalently bond with the azide group via the cycloaddition process, thereby forming a triazole group.

In yet another aspect, the present disclosure provides a semiconductor structure that includes a first substrate, a second substrate, and a composite bonding layer coupled to the first substrate and the second substrate, where the composite bonding layer includes a triazole moiety.

In some implementations, the composite bonding layer is covalently coupled to a first surface of the first substrate via a first base molecule and to a second surface of the second substrate via a second base molecule.

In some implementations, the first substrate includes a first conductive feature disposed in a first dielectric layer and the second substrate includes a second conductive feature disposed in a second dielectric layer, where the composite bonding layer extends between the first dielectric layer and the second dielectric layer. In some implementations, the composite bonding layer extends to contact a sidewall of each of the first conductive feature and the second conductive feature.

According to one method, an alkyne-azide reaction is used for bonding through a so-called click chemistry. An azide-functionalized bonding layer is formed on a first surface and an alkyne-functionalized layer is formed on a second surface to be bonded to the first surface. The alkyene- and azide-functionalized surfaces react to form a composite bonding layer including a triazole bridging (or linking) ring structure at a bonding interface. In some examples, forming the triazole bridging structure between the bonding layers may require lower processing temperature than existing bonding methods. As an example, a Huisgen's 1,3-dipolar cycloaddition (as opposed to a copper (Cu)-catalyzed azide-alkyne cycloaddition (CuAAC)) may be used to covalently link bonding surfaces of two opposing substrates.

In some examples, the alkyne-functionalized bonding layer may include a plurality of base molecules (or functional groups) R1 each terminated by an alkyne moiety (or functional group), and the azide-functionalized bonding layer may include a plurality of base molecules R2 (or functional groups) each terminated by an azide moiety (or functional group). Choosing specific compositions and/or chain lengths of the base molecules R1 and R2 can tune the thickness and physical properties of the composite bonding layer. In one example, the compositions of the base molecules R1 and R2 may be controlled to achieve benefits such as resistance to copper diffusion into adjacent dielectric layers. In another example, oligomer and polymers of various lengths (e.g., molecular weight) may be used to create various thicknesses of the composite bonding layer between the bonded substrates. If the base molecules R1 and R2 with relatively more non-polar bonds (e.g. Si—C type bonds) as their backbone components are utilized, copper diffusion may be reduced compared to more polar bonds such as Si—O bonds. In such applications, silicon-containing backbone components may be more stable than purely organic (e.g., containing carbon, hydrogen, oxygen, etc.) compounds, though either could be used in the base molecules R1 and R2 depending on the applications.

Bonding according to the methods and using the materials described herein has several advantages. Utilizing the curable bonding layer(s) in a direct or hybrid bonding process creates a bonding interface having non-polar bonds or bonds with lower-polarity (e.g., compared to Si—O bonds typical to bonding interfaces with no curable bonding layers). The bonding of the curable bonding layers relies on a non-reversible or harder-to-reverse reaction. Using more stable functional groups, queue time effects can be reduced, minimized, or negated. In the present implementations, plasma activation and/or treatment with water may be omitted prior to the bonding process, thus saving time and cost of the overall fabrication process. Accordingly, improved bonding strength is achieved between two surfaces in a bonded structure.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 2 and 3 each illustrate a flowchart of an example method of fabricating a semiconductor structure, in accordance with some embodiments.

DETAILED DESCRIPTION

Figure 1A:
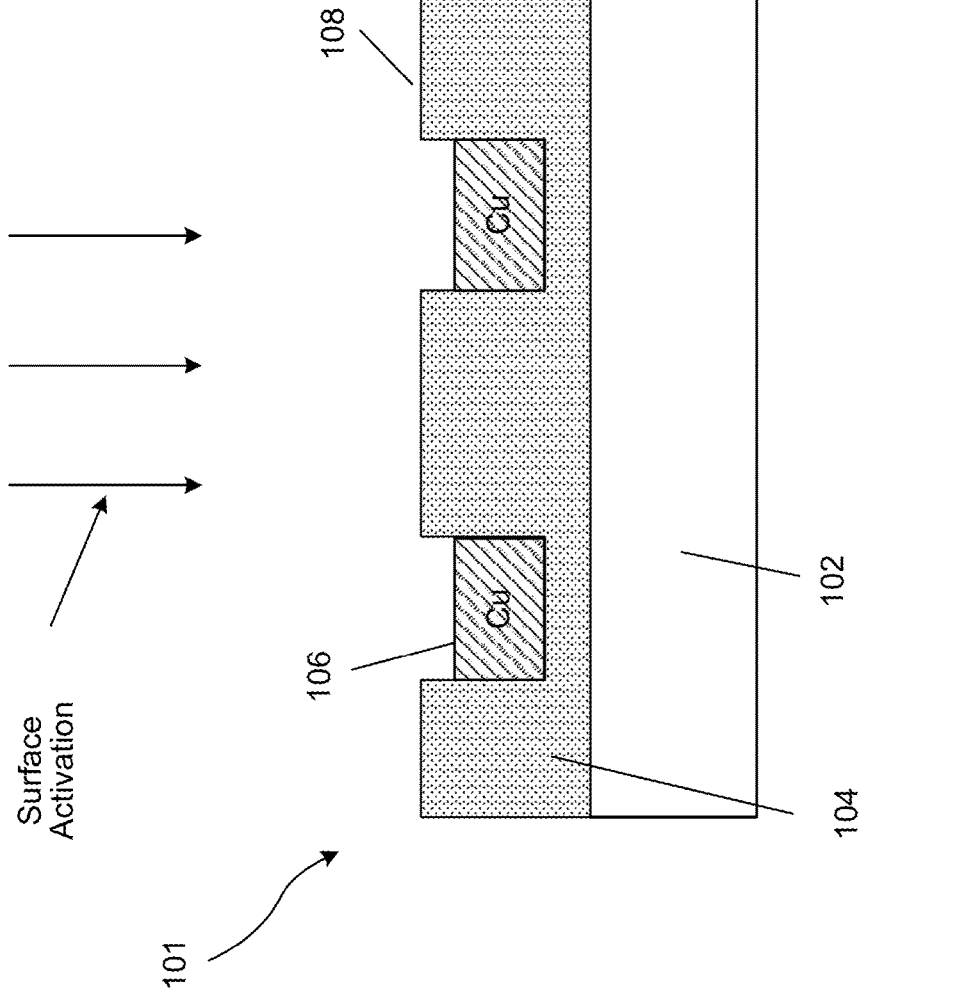
FIGS. 1A, 1B, 1C, and 1D collectively illustrate an example hybrid bonding process according to conventional techniques.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used or other changes may be made without departing from the spirit or scope of the present disclosure. The illustrative embodiments described in the detailed description are not meant to be limiting of the subject matter presented.

According to one implementation, a first substrate is to be bonded to a second substrate by an improved direct or hybrid bonding technique. A first bonding layer, such as an alkyne-functionalized layer, is formed on a first substrate and a second bonding layer, such as an azide-functionalized layer, is formed on a second substrate. Each of these layers may be about 1 nm to about 10 nm in thickness and may be selectively formed or blanket deposited and then thinned to expose underlying conductive features (if applicable) using a polishing (e.g. a chemical mechanical polishing, or CMP, process) or etching technique. In the case of hybrid bonding, where conductive and dielectric materials are exposed at each bonding surface, the first bonding layer and the second bonding layer can each be selectively applied as a self-assembled monolayer (SAM) only on the dielectric materials or it may be applied on both conductive and dielectric materials and then processed (e.g. by polishing or etching) to reveal the underlying conductive materials. The first bonding surface and the second bonding surface are brought together to covalently link or crosslink the functional groups (i.e., the alkyne group and the azide group) across a bonding interface. This process can be performed at relatively low temperatures, such as at about 400° C. to about 500° C. or lower.

By using a chemically driven process for bond formation, the processing temperature can be reduced over conventional bonding techniques. The use of chemical surface treatments can be selectively formed on oxides or other insulating layers in order to avoid interference with metal-metal contacts used to interconnect conductive features of opposing substrates.

Figure 3:
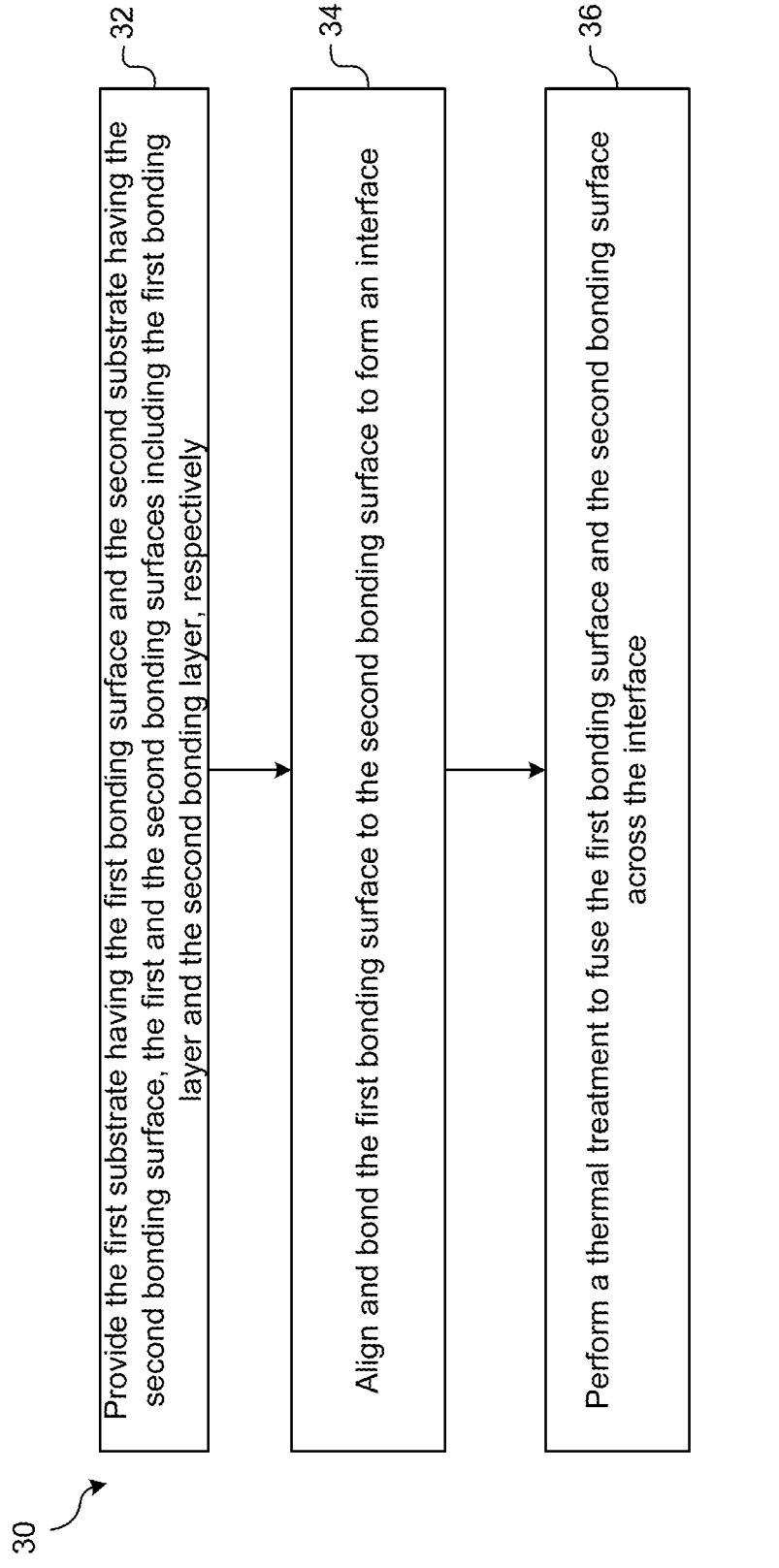

FIG. 2 illustrates a flowchart of an example method 10 for forming a bonding surface over a semiconductor structure, according to some implementations of the present disclosure. FIG. 3 illustrates a flowchart of an example method 30 for bonding or coupling bonding surfaces of two semiconductor structures (e.g., two semiconductor substrates, two semiconductor wafers, two semiconductor dies, etc.), according to some implementations of the present disclosure. It is noted that the methods 10 and 30 are merely examples and are not intended to limit the present disclosure. It is further understood that additional operations may be provided before, during, and after the method 10 of FIG. 2 and/or the method 30 of FIG. 3 and that some other operations may only be briefly described herein.

In various implementations, operations of the method 10 may be associated with an example semiconductor structures 200 and 250 at various fabrication stages illustrated in FIGS. 4A-7B, and operations of the method 30 may be associated with an example semiconductor structure 300 at various fabrication stages illustrated in FIGS. 8A and 8B, which will be discussed in further detail below. Furthermore, one or more operations of the method 30 may be associated with a schematic reaction 400 illustrated in FIG. 9. It should be understood that the semiconductor structures 200, 250, and 300 may each include a number of other devices such as inductors, fuses, capacitors, coils, etc., while remaining within the scope of the present disclosure.

Figure 4A:
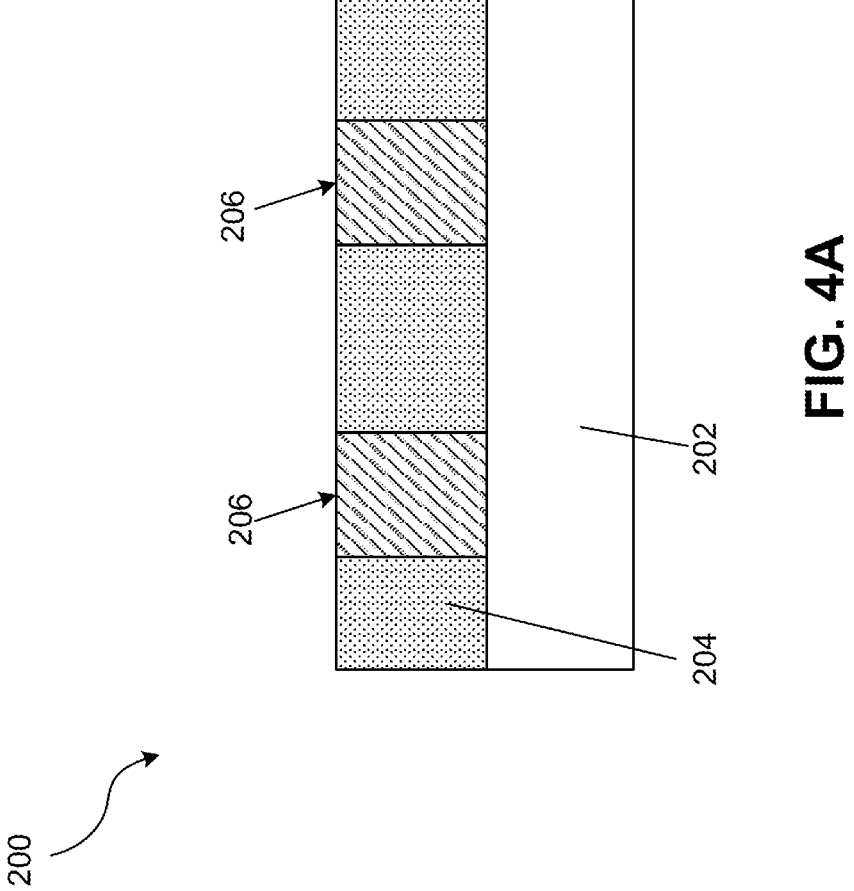
FIGS. 4A, 4B, 4C, 4D, and 4E each illustrate a cross-sectional side view of an example semiconductor structure at intermediate steps of the method illustrated in one or more of FIGS. 2 and 3, in accordance with some embodiments.

Referring to FIGS. 2 and 4A, the method 10 at operation 12 provides the first semiconductor structure 200 that includes a semiconductor substrate (e.g., a base substrate) 202.

The semiconductor substrate 202 includes a semiconductor material, such as a bulk semiconductor, a semiconductor-on-insulator (SOI), or the like, which may be doped (e.g., with a p-type or an n-type dopant) or undoped. The semiconductor substrate 202 may be or correspond to a wafer (e.g., 202 or 204), such as a silicon wafer. Generally, an SOI includes a layer of a semiconductor material formed on an insulator layer. The insulator layer may be, for example, a buried oxide (BOX) layer, a silicon oxide layer, or the like. The semiconductor substrate 202 may include other semiconductor materials, such as a multi-layered or gradient semiconductor material. In some examples, the semiconductor substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Subsequently, the method 10 at operation 14 forms a dielectric layer (e.g., insulating layer) 204 on or overlaying the semiconductor substrate 202. In the present implementations, the dielectric layer 204 and the subsequently-formed conductive features formed therein constitute a first bonding surface 214 of the first semiconductor structure 200. In some implementations, the first bonding surface 214 is over a front side of the semiconductor substrate 202 (e.g., over a surface that includes the device features of the first semiconductor structure 200). Alternatively, the first bonding surface 214 may be over a back side of the semiconductor substrate 202 (e.g., over a surface opposing the device features of the first semiconductor structure 200).

The dielectric layer 204 may include any suitable material, such as an oxide, a nitride, a carbide, the like, or combinations thereof. Non-limiting examples include silicon oxide ($SiO_2$), silicon nitride (SiN), silicon carbonitride (SiCN), a low-k dielectric material (e.g., a dielectric material having a dielectric constant less than that of silicon oxide, which is about 3.9), the like, or combinations thereof. The dielectric layer 204 may be formed or deposited using at least one suitable deposition technique, such as chemical vapor deposition (CVD), flowable CVD (FCVD), atomic layer deposition (ALD), spin coating, the like, or combinations thereof.

Though not depicted separately for the sake of simplicity, the first semiconductor structure 200 may include a number of device features (e.g., transistors, diodes, resistors, etc) within and/or over the semiconductor substrate 202 and a number of interconnect structures (alternatively referred to as conductive features, such as vias and conductive lines) formed over the device features. Example transistors may include field-effect transistors (FETs) such as fin-like FET (e.g., FinFET), multi-gate FETs, nanosheet FETs, the like, or combinations thereof. The interconnect structures may be configured to electrically connect the device features to one another so as to form an integrated circuit, which can function as a logic device, a memory device, an input/output device, or the like. The device features may include doped or undoped semiconductor materials, which may be similar in composition as the semiconductor substrate 202.

The interconnect structures may include a conductive material, such as Cu, tungsten (W), nickle (Ni), aluminum (Al), ruthenium (Ru), silver (Ag), gold (Au), platinum (Pt), titanium (Ti), tantalum (Ta), TiN, TaN, the like, or combinations thereof, disposed in a dielectric (e.g., insulating) material, such as oxide, nitride, carbide, the like, or combinations thereof. The device features and the interconnect structures may be formed within intervening dielectric layers (e.g., intermetal dielectric layers, interlevel/interlayer dielectric layers, etch-stop layers, etc.) between the semiconductor substrate 202 and the dielectric layer 204, such as in a front-end-of-line (FEOL) or back-end-of-line (BEOL) layers. The intervening dielectric layers may be similar to the dielectric layer 204 in composition.

Still referring to FIGS. 2 and 4A, the method 10 at operation 16 forms a conductive feature 206 in the dielectric layer 204 to interconnect with one or more underlying conductive features (e.g., metallization layers, interconnect structures, device features, etc.).

The conductive feature 206 may include any suitable conductive material including Cu, W, Ni, Al, ru, Ag, Au, Pt, Ti, Ta, TiN, TaN, the like, or combinations thereof. In the depicted implementations, the conductive feature 206 includes Cu.

In some implementations, forming the conductive feature 206 includes forming a recess (not depicted) in the dielectric layer 204 by performing a patterning process. For example, a patterned mask layer (not depicted) may be formed over the dielectric layer 204 using a suitable lithography technique, where the patterned mask layer is formed with an opening corresponding to a position of the recess, and the dielectric layer 204 may be etched or patterned using the patterned mask layer as an etch mask, resulting in the recess in the dielectric layer 204.

Subsequently, a conductive layer may be deposited as a blanket layer over the first semiconductor structure 200 to fill the recess and overlay the top surface of the dielectric layer 204. The conductive layer may be deposited by any suitable deposition technique, such as CVD, ALD, PVD, plating (e.g., electroplating, electroless plating, etc.), the like, or combinations thereof. The blanket layer and any underlying layers may then be etched (e.g., by a dry etching, a reactive ion etching (RIE), or a wet etching process) or polished (e.g., by a chemical-mechanical polishing/planarization, or CMP, process) until the top surface of the dielectric layer 204 is exposed, thereby forming the conductive feature 206 in the dielectric layer 204. The conductive feature 206 may be formed as part of an FEOL process, a middle-end-of-line (MEOL) process, or a BEOL process. For example, the conductive feature 206 may be formed as a bonding pad for coupling the first semiconductor structure 200 to another semiconductor structure, die, substrate, or the like as a portion of a package.

Figure 4B:
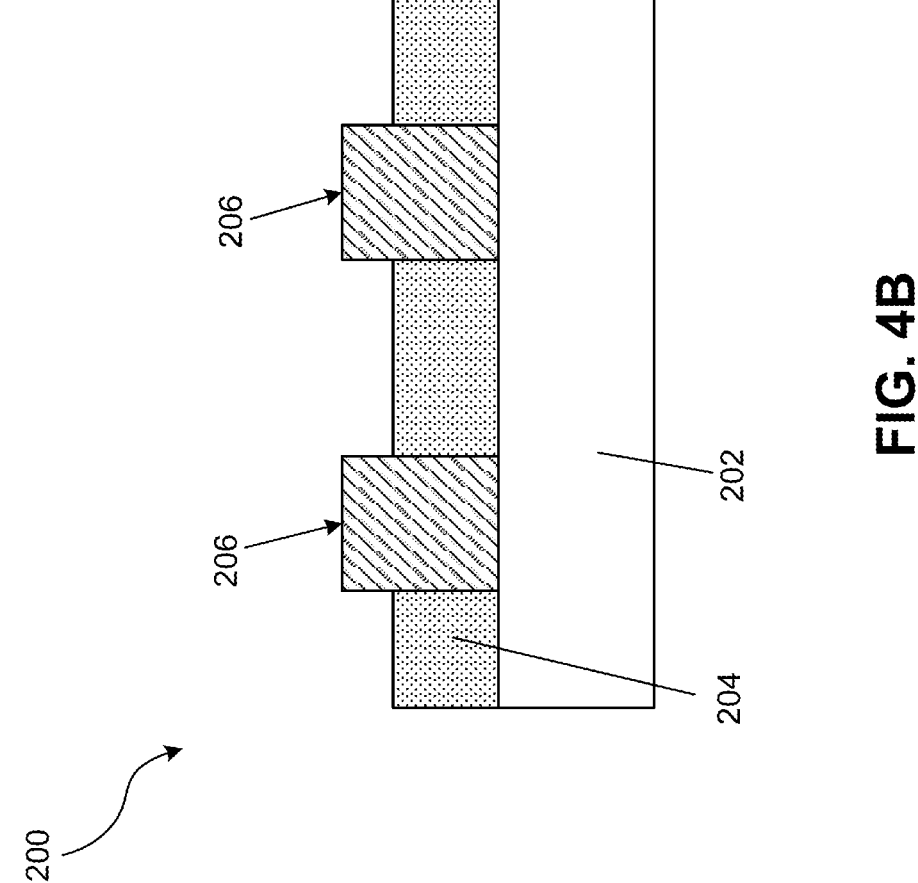

In some implementations, referring to FIG. 4B, the method 10 at operation 16 subsequently recesses the dielectric layer 204 to expose a top portion, including sidewalls, of the conductive feature 206, thereby causing the conductive feature 206 to protrude from a top surface of the recessed dielectric layer 204. The dielectric layer 204 may be recessed by any suitable method. In one example, the dielectric layer 204 may be etched back using a suitable etching process (e.g., a dry etching process, a wet etching process, etc.). In another example, a sacrificial layer may be formed over the dielectric layer 204 before forming the conductive feature 206 (e.g., at operation 14) and then selectively removed after forming the conductive feature 206 (e.g., at operation 16), thereby exposing the top portion of the conductive feature. In yet another example, the conductive feature 206 may be coplanar with or recessed slightly from the top surface of the dielectric layer 204 to accommodate formation of a thin layer of the first bonding layer 209a. In this regard, the recessing of the dielectric layer 204 may be omitted.

Referring to FIGS. 2 and 4C-4E collectively, the method 10 at operation 18 forms the first bonding layer 209a selectively over the dielectric layer 204 and adjacent the conductive feature 206.

Figure 9:
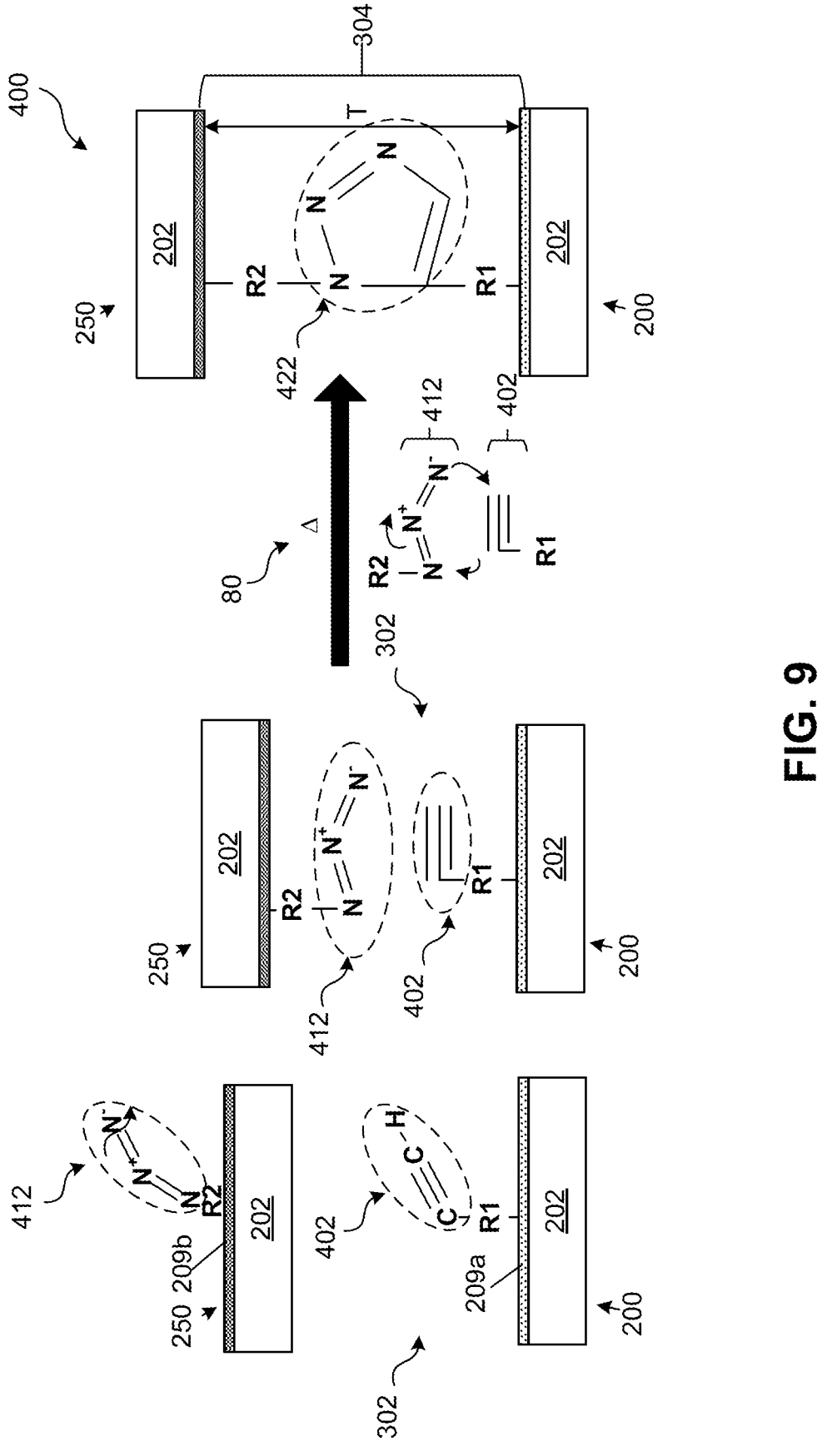
FIG. 9 illustrates a schematic reaction of bonding two substrates with surfaces functionalized with different moieties, in accordance with some embodiments.

In the present implementations, referring to FIG. 9, the first bonding layer 209a includes a plurality of molecules each terminated by an alkyne (—C≡CH) moiety (or group) 402 extending from the first bonding surface 214. In some implementations, the molecules are organized as a self-assembled monolayer (SAM) extending from the first bonding surface 214. In the present implementations, each alkyne moiety 402 is coupled to the first bonding surface 214 by a first base molecule R1, which may include an oligomer or a polymer having a backbone of repeating monomers. In some implementations, the number of the repeating monomers determines a chain length of the first base molecule R1. In this regard, the molecular weight (MW) of the first base molecule R1 varies proportionally with the chain length of the first base molecule R1. The base molecule R1 may further include sidechain functional groups coupled to the backbone. In some implementations, properties of the first bonding layer 209a may be tuned by controlling the chain length and/or the sidechain functional groups coupled to the backbone of the first base molecule R1. For example, a thickness of the subsequently-formed composite bonding layer 304 may be tuned by controlling the chain length of at least the first base molecule R1.

Figure 4C:
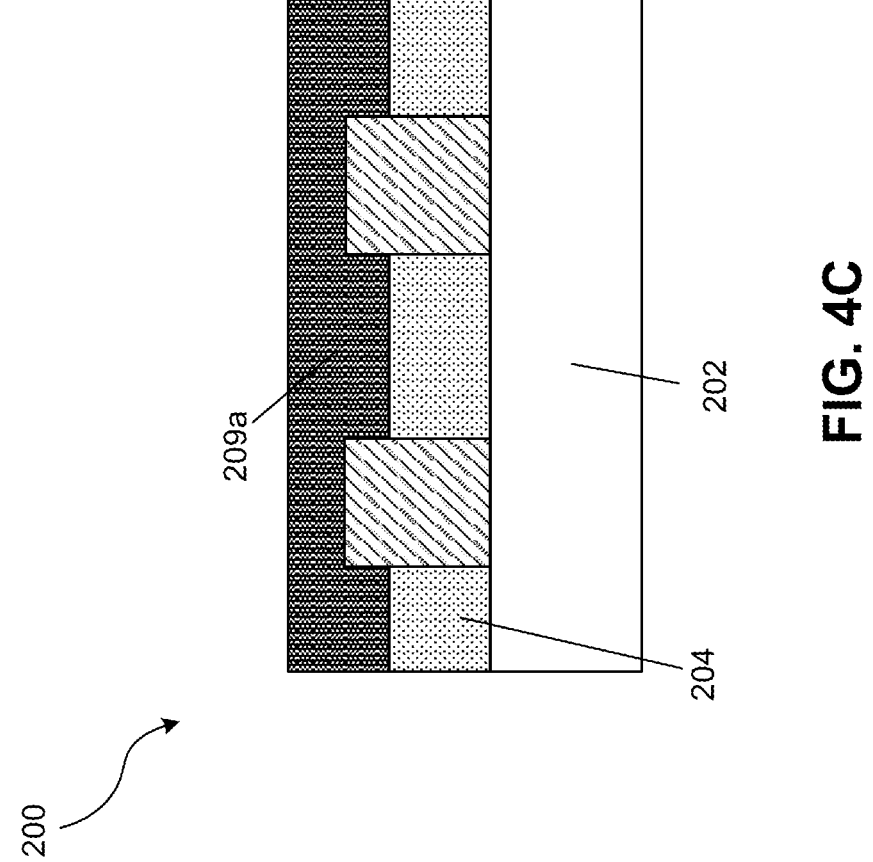

In some implementations, referring to FIG. 4C, the first bonding layer 209a is deposited as a blanket SAM over the dielectric layer 204 and the conductive feature 206, thereby completely covering the exposed top portion of the conductive feature 206. The first bonding layer 209a may be deposited by any suitable method, such as spin-coating, to form a thickness sufficient to cover a top surface of the conductive feature 206.

Subsequently, referring to FIG. 4D, the method 10 removes portions of the first bonding layer 209a to expose the top surface of the conductive feature 206, thereby leaving remaining portions of the first bonding layer 209a over the dielectric layer 204 and adjacent the conductive feature 206. In some implementations, the remaining portions of the first bonding layer 209*a* are substantially copla-nar with the conductive feature 206.

Figure 4D:
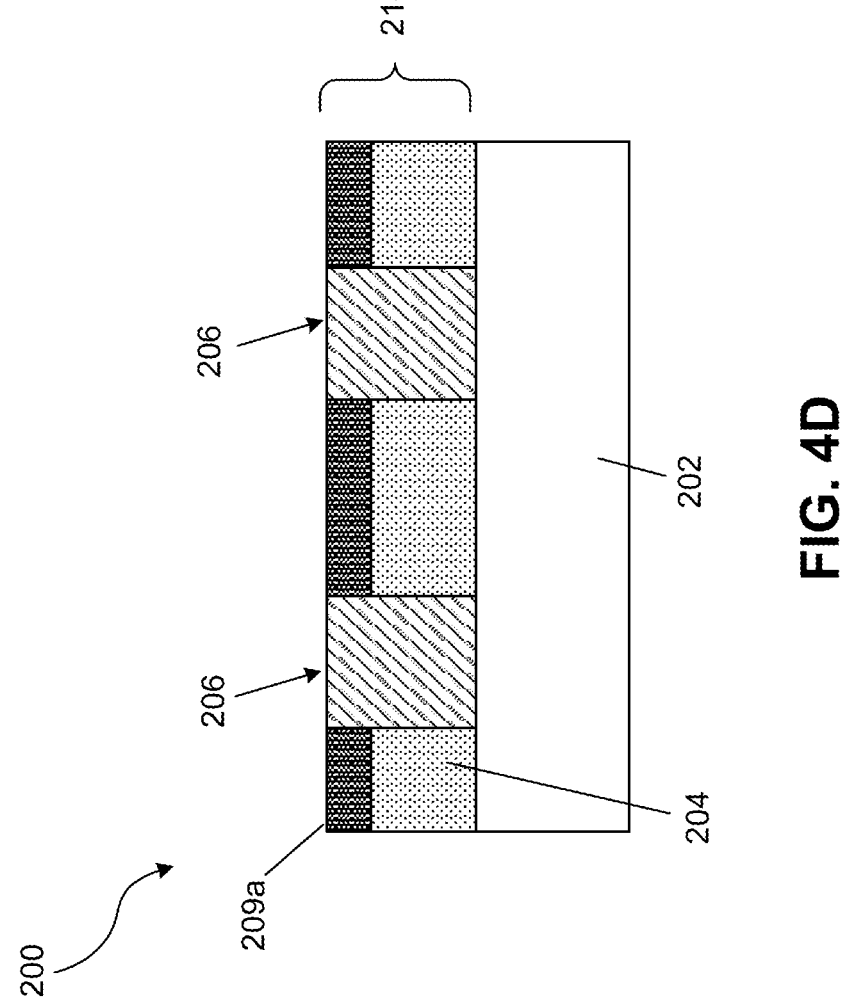

In some implementations, still referring to FIG. 4D, the portions of the first bonding layer 209*a* are removed by applying a CMP process to planarize the top surface of the conductive feature 206 with a top surface of the first bonding layer 209*a*. In some implementations, the portions of the first bonding layer 209*a* are removed by a suitable selective etching process (e.g., a dry etching process, a wet etching process, etc.) to expose the top surface of the conductive feature 206.

Figure 4E:
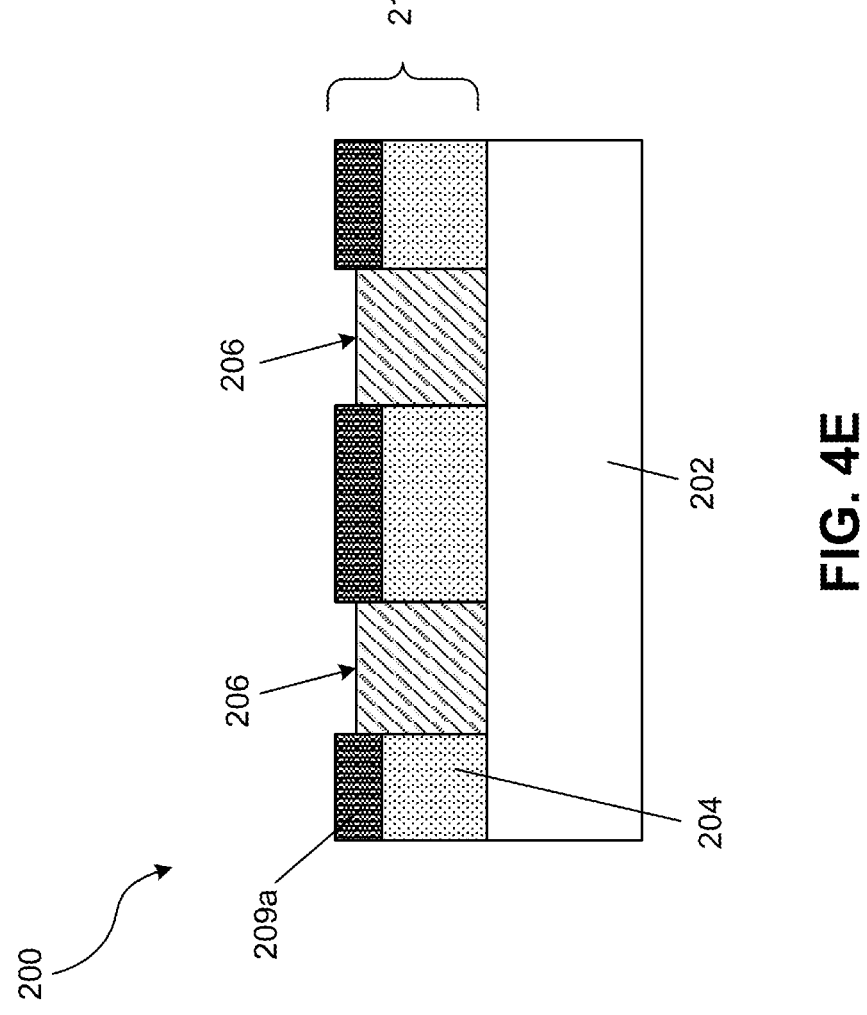

Referring to FIG. 4E, the method 10 recesses the con-ductive feature 206 such that the first bonding layer 209*a* protrudes from a top surface of the recessed conductive feature 206, resulting in the first bonding surface 214 over the semiconductor substrate 202. The conductive feature 206 may be selectively recessed by a suitable etching process (e.g., a dry etching process, a wet etching process, etc.). In some examples, the conductive feature 206 may be recessed by about 1 nm to about 5 nm. In some implemen-tations, recessing the conductive feature 206 creates space over the conductive feature 206 to allow its expansion of across a bonding interface during the subsequent thermal treatment, annealing process, and/or bonding process.

Figure 5A:
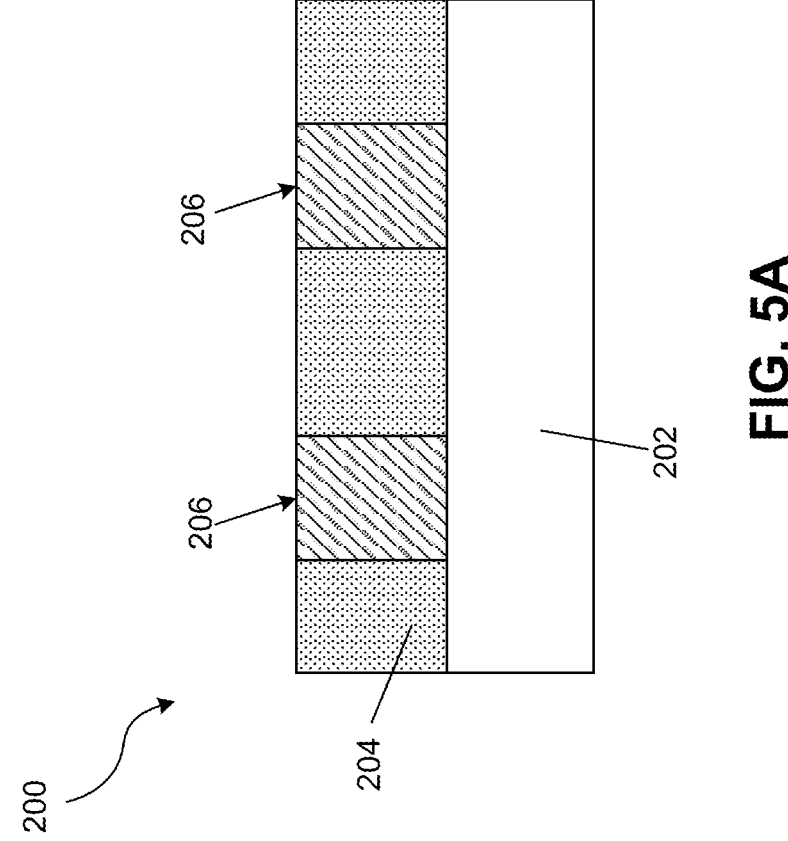
FIGS. 5A and 5B each illustrate a cross-sectional side view of an example semiconductor structure at intermediate steps of the method illustrated in one or more of FIGS. 2 and 3, in accordance with some embodiments.
Figure 5B:
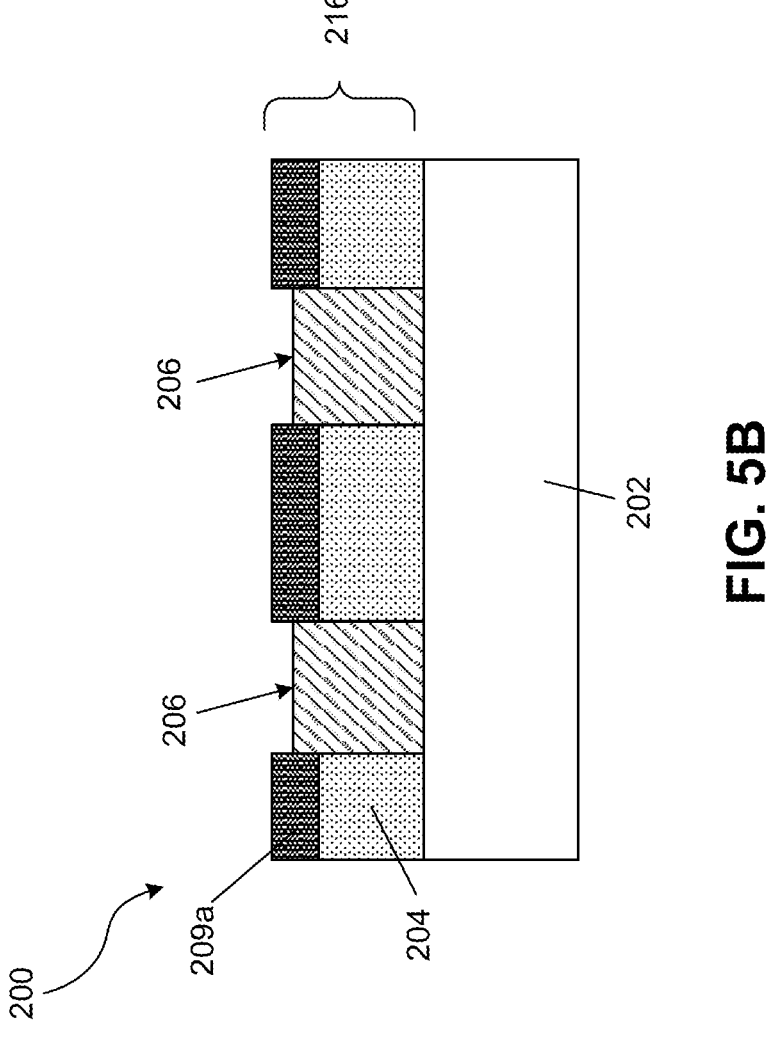

In alternative implementations, referring to FIGS. 2, 5A, and 5B collectively, the first bonding layer 209*a* may be formed at operation 18 by performing a selective deposition process.

After forming the conductive feature 206 (see FIG. 5A, which is similar to FIG. 4A), the first bonding layer 209*a* is selectively deposited over the dielectric layer 204 to expose the top surface of the conductive feature 206 as shown in FIG. 5B, resulting in the first bonding surface 214. The first bonding layer 209*a* may be selectively deposited by any suitable method. For example, the top surface of the dielec-tric layer 204 may be functionalized with a linking moiety (e.g., functionalize the dielectric layer 204 (e.g., including silicon dioxide) with a hydroxide group (—OH), which can then be coupled to the first base molecule R1). Additionally, the top surface of the dielectric layer 204 may be function-alized with the first base molecule R1 before coupling the alkyne moiety 402 thereto.

In some implementations, the top surface of the conduc-tive feature 206 is below the top surface of the first bonding layer 209*a*. In some implementations, the conductive feature 206 may be optionally recessed such that the top surface of the conductive feature 206 is about 1 nm to about 5 nm below the top surface of the curable bonding layer 209.

In the present implementations, referring to FIGS. 2 and 6A-7B collectively, operations 12-18 of the method 10 are also applicable for forming a second semiconductor struc-ture 250. In the present implementations, the second semi-conductor structure 250 is formed to have a second bonding surface 216 different from the first bonding surface 214 in composition.

Figure 6A:
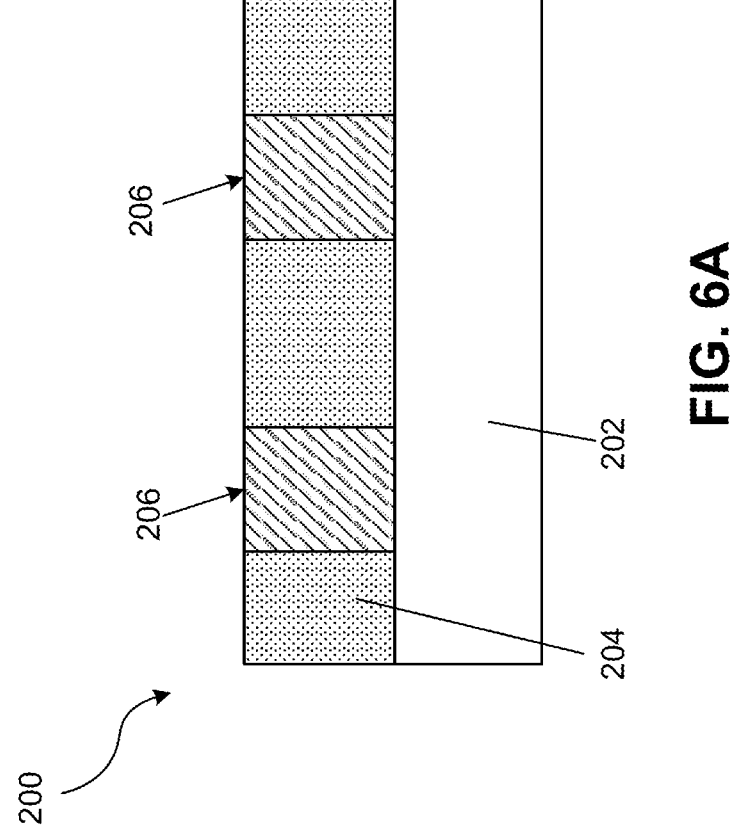
FIGS. 6A, 6B, 6C, 6D, and 6E each illustrate a cross-sectional side view of an example semiconductor structure at intermediate steps of the method illustrated in one or more of FIGS. 2 and 3, in accordance with some embodiments.
Figure 6B:
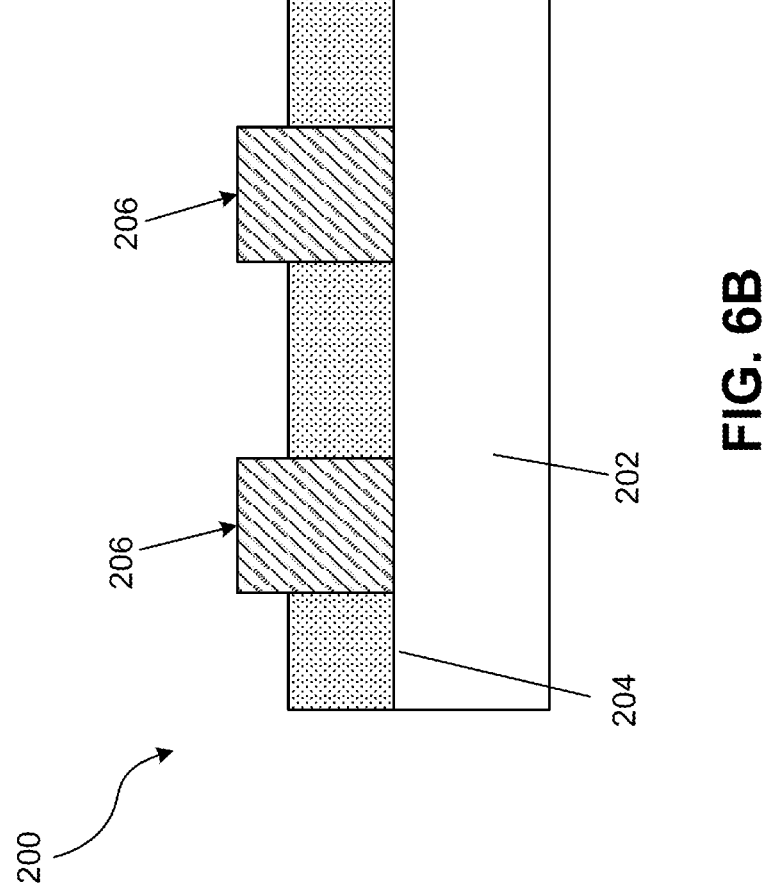
Figure 6C:
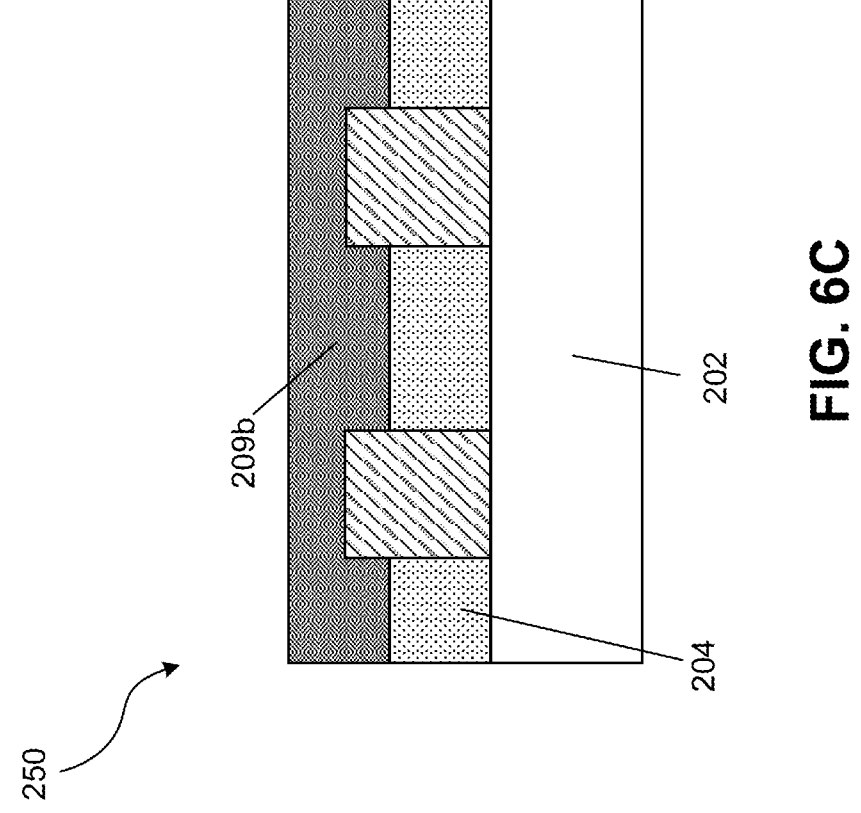
Figure 6D:
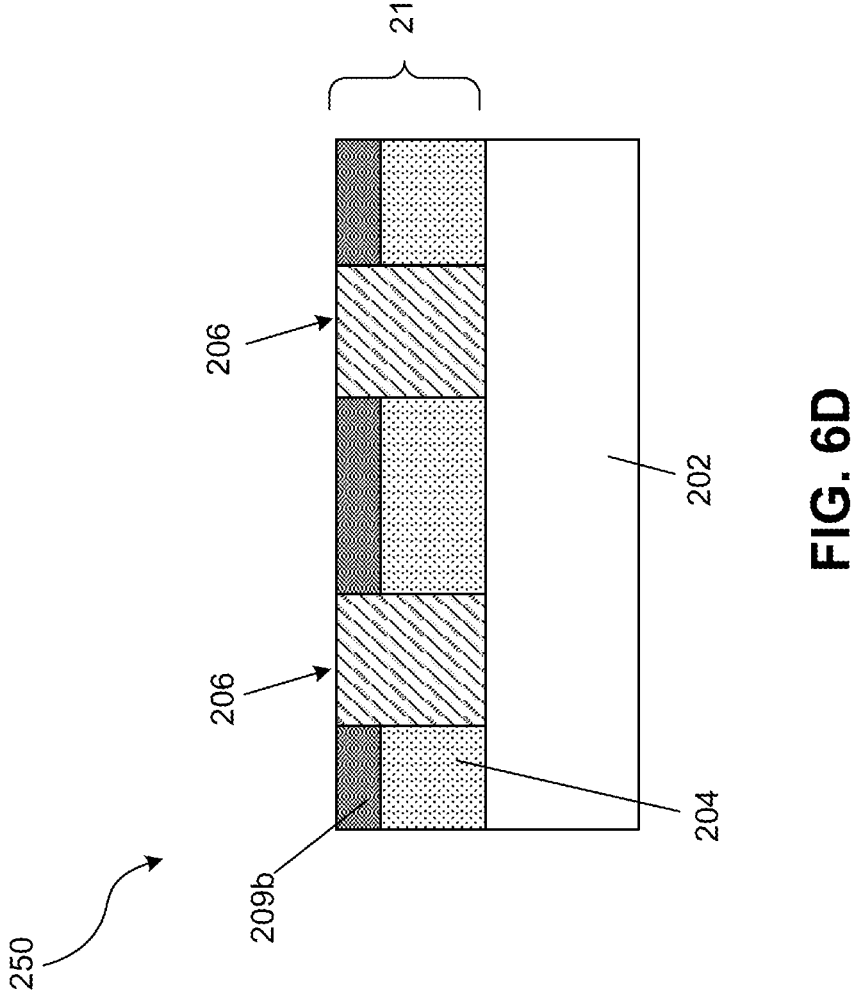
Figure 6E:
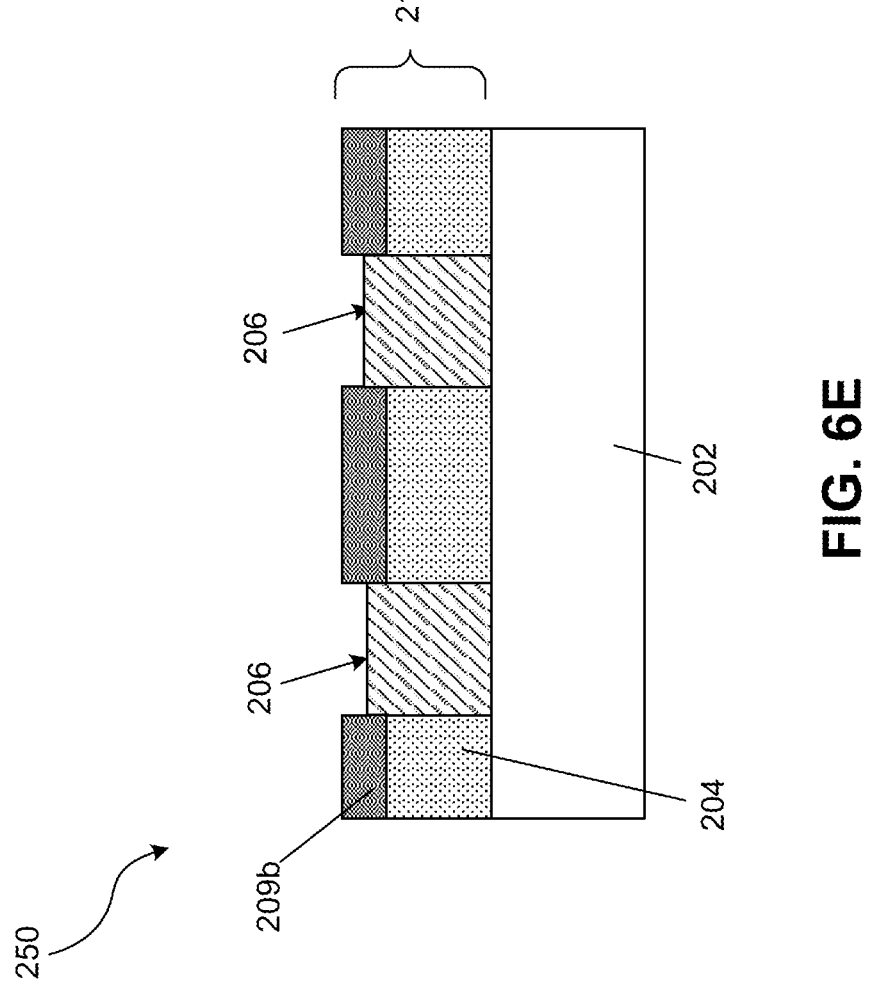
Figure 7A:
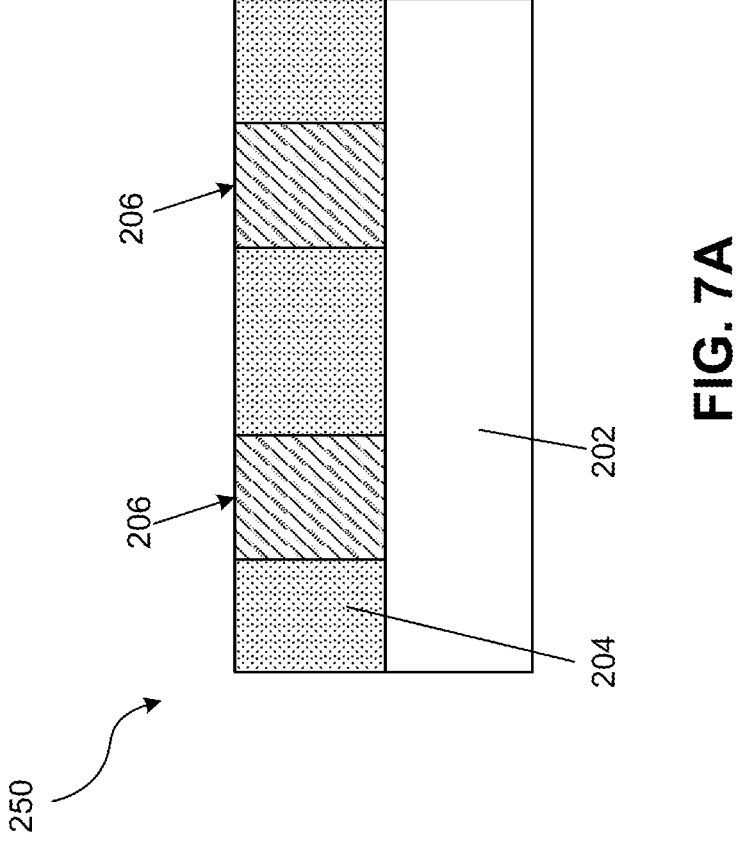
FIGS. 7A and 7B each illustrate a cross-sectional side view of an example semiconductor structure at intermediate steps of the method illustrated in one or more of FIGS. 2 and 3, in accordance with some embodiments.
Figure 7B:
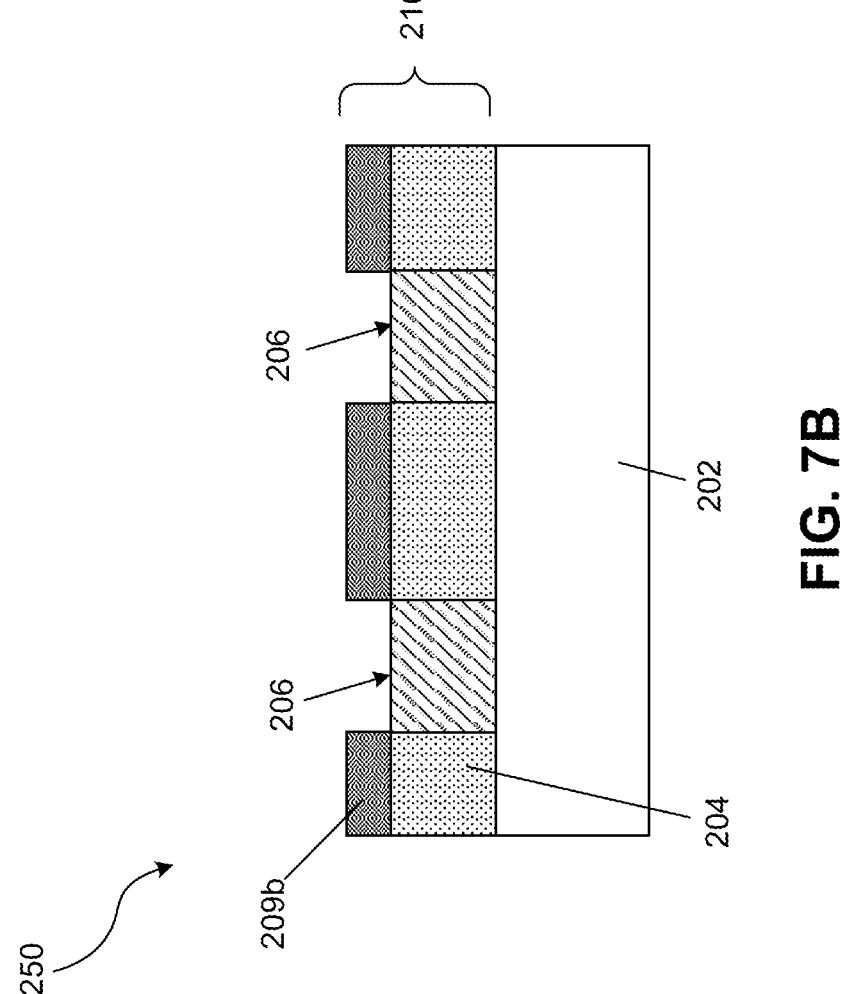

In particular, referring to FIGS. 6A and 7B, for example, the second bonding surface 216 includes a second bonding layer 209*b* formed over the dielectric layer 204 and adjacent the conductive feature 206. Referring to FIG. 9, the second bonding layer 209*b* includes a plurality of molecules each terminated by an azide (—N=N$^+$=N$^-$) moiety (or group) 412 extending from the second bonding surface 216. In some implementations, the molecules are organized as a SAM extending from the second bonding surface 216. In the present implementations, each azide moiety 412 is coupled to the second bonding surface 216 by a second base mol-ecule R2, which may include an oligomer or a polymer having a backbone of repeating monomers. In some imple-mentations, the number of the repeating monomers deter-mines a chain length of the second base molecule R2, such that the MW of the second base molecule R2 varies pro-portionally with the chain length of the second base mol-ecule R2. The second base molecule R2 may further include sidechain functional groups coupled to the backbone. Simi-lar to the first bonding layer 209*a,* properties of the second bonding layer 209*b* may be tuned by controlling the chain length and/or the sidechain functional groups coupled to the backbone of the second base molecule R2. For example, the thickness of the subsequently-formed composite bonding layer 304 may be tuned by controlling the chain length of the first base molecule and/or the second base molecule R2.

In some implementations, the second semiconductor structure 250 may be formed by a method the same as that of the semiconductor structure 200, i.e., the method 10. For example, implementations of the second semiconductor structure 250 depicted in FIGS. 6A-6E correspond to those of the first semiconductor structure 200 depicted in FIGS. 4A-4E, and implementations of FIGS. 7A and 7B corre-spond to those of FIGS. 5A and 5B.

Figure 8A:
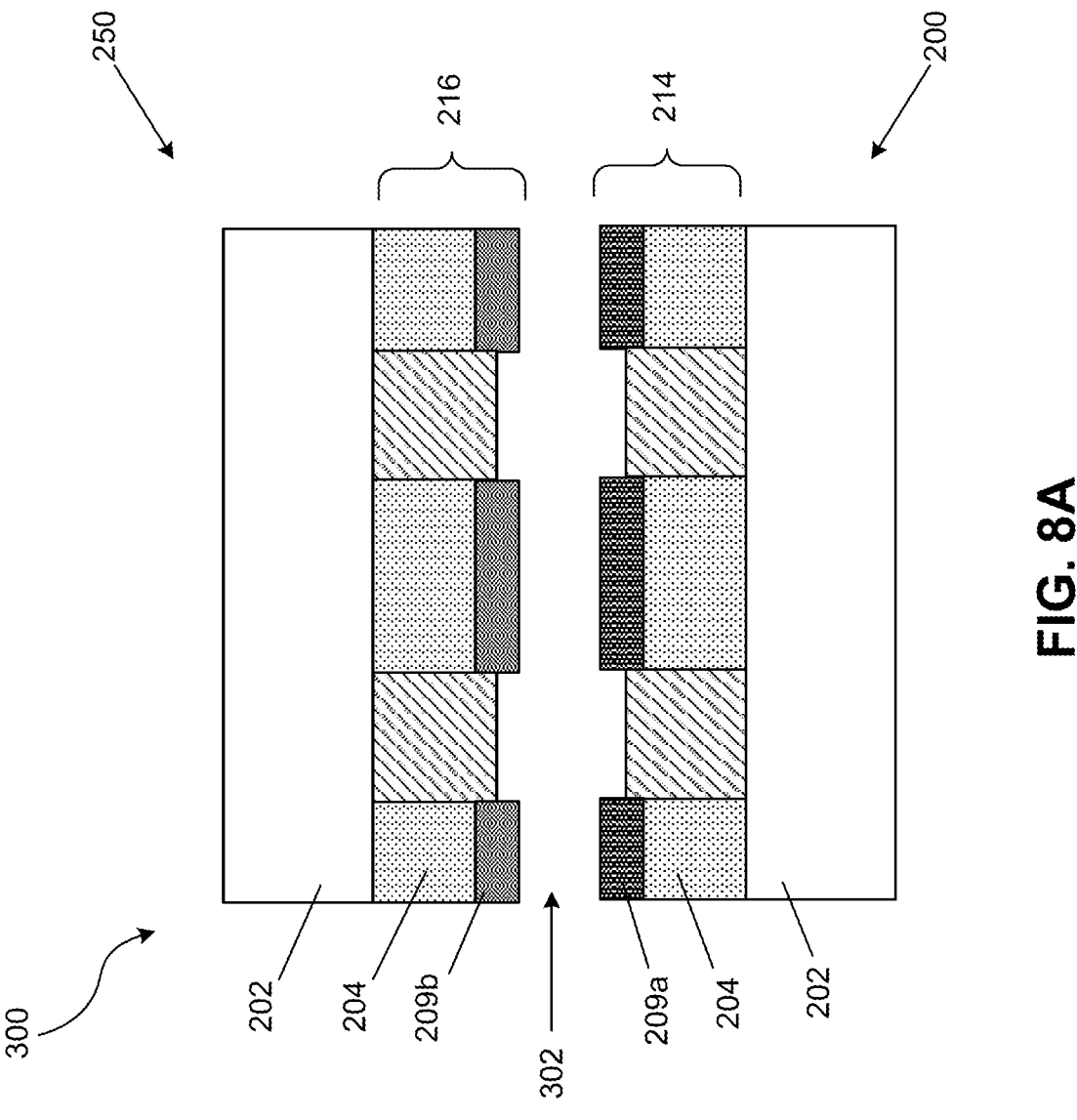
FIGS. 8A and 8B each illustrate a cross-sectional side view of an example semiconductor structure at intermediate steps of the method illustrated in one or more of FIGS. 2 and 3, in accordance with some embodiments.
Figure 8B:
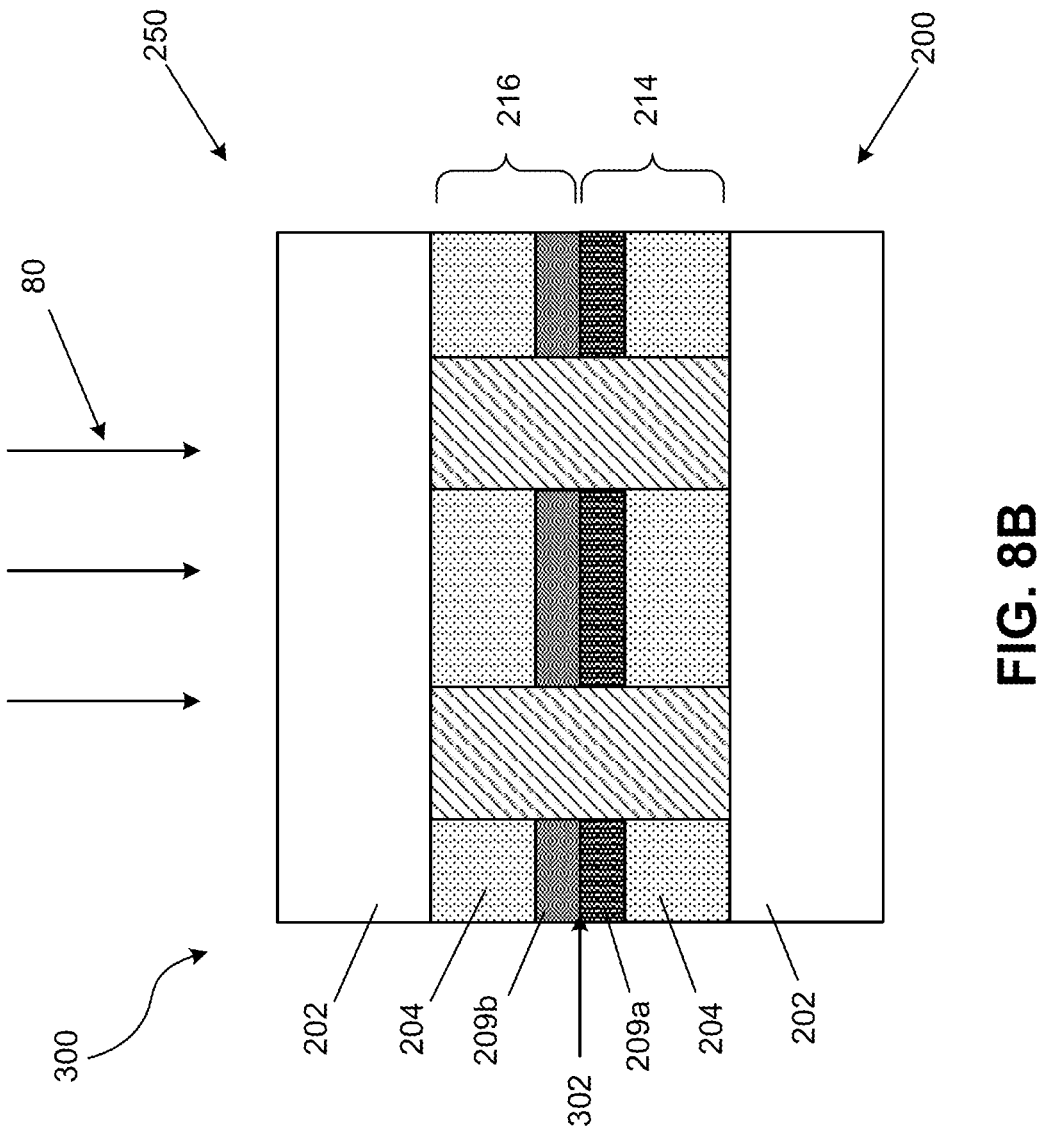

Now referring to FIGS. 3, 8A, and 8B, the method 30 provides an example process for bonding or coupling the first bonding surface 214 of the first semiconductor structure 200 with the second bonding surface 216 of the second semiconductor structure 250.

Referring to FIGS. 3 and 8A, the method 30 at operation 32 provides the first semiconductor structure 200 and the second semiconductor structure 250, where the first semi-conductor structure 200 includes the first bonding surface 214 and the second semiconductor structure 250 includes the second bonding surface 216 formed according the method 10 provided herein. For example, the first bonding surface 214 includes the first bonding layer 209*a* over the dielectric layer 204 and the conductive feature 206 disposed in the dielectric layer 204, and the second bonding surface 216 includes the second bonding layer 209*b* over the dielectric layer 204 and the conductive feature 206 disposed in the dielectric layer 204.

Subsequently, still referring to FIGS. 3 and 8A, the method 30 at operation 34 aligns and bonds the first bonding surface 214 and the second bonding surface 216 to make physical and direct contact therebetween, resulting in a semiconductor structure (e.g., bonded structure) 300. In the present implementations, the physical and direct contact establishes a bonding interface 302 between the first bond-ing surface 214 and the second bonding surface 216. In some implementations, the second semiconductor structure 250 (or the first semiconductor structure 200) is first flipped or inverted (e.g., rotated 180°), such that the first bonding surface 214 and the second bonding surface 216 are dis-posed opposing one another and bonded in a face-to-face configuration during an alignment process.

The first bonding surface 214 and the second bonding surface 216 may be bonded by any suitable process, such as by a hybrid bonding process or a direct bonding process. In this regard, the bonding process may be implemented by aligning similar features of the first bonding surface 214 and the second bonding surface 216 with one another, such that metal-to-metal contact can be formed across the bonding interface 302 between the conductive features 206 and dielectric-to-dielectric contact can be formed across the bonding interface 302 between the dielectric layers 204.

Figure 1B:
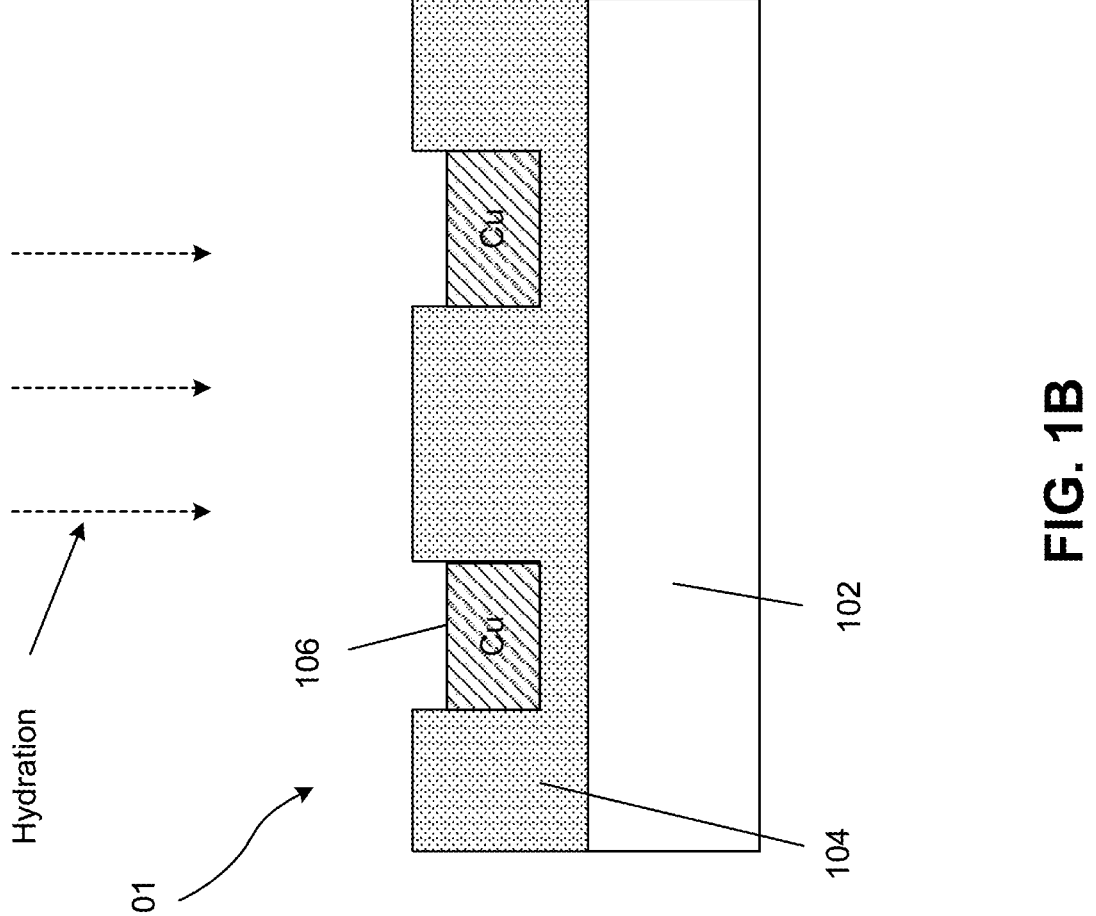
Figure 1C:
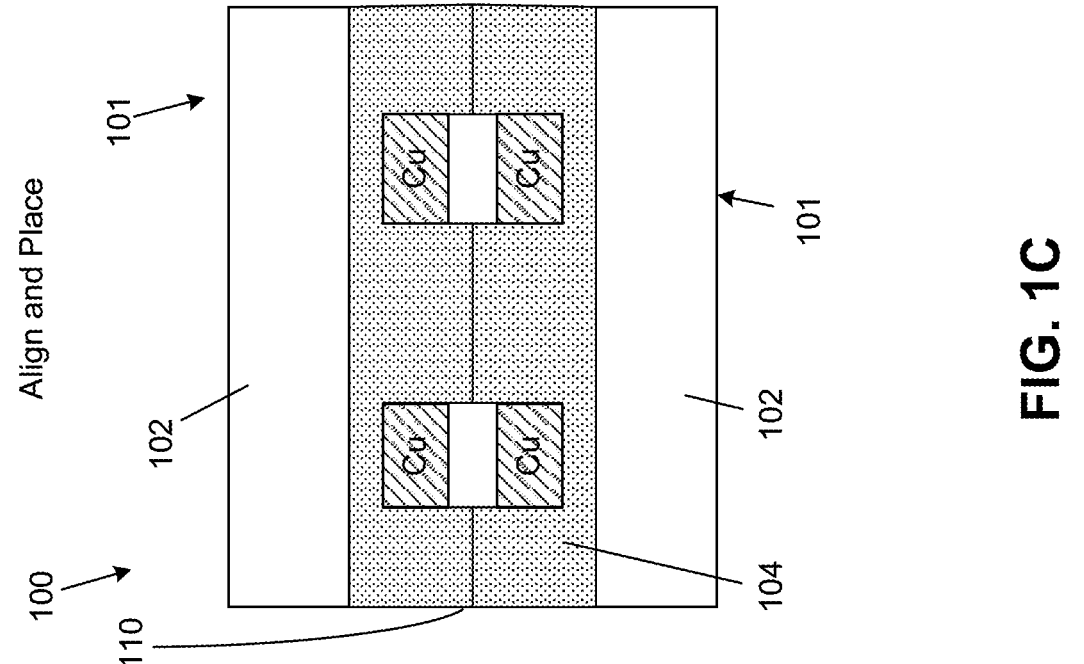
Figure 1D:
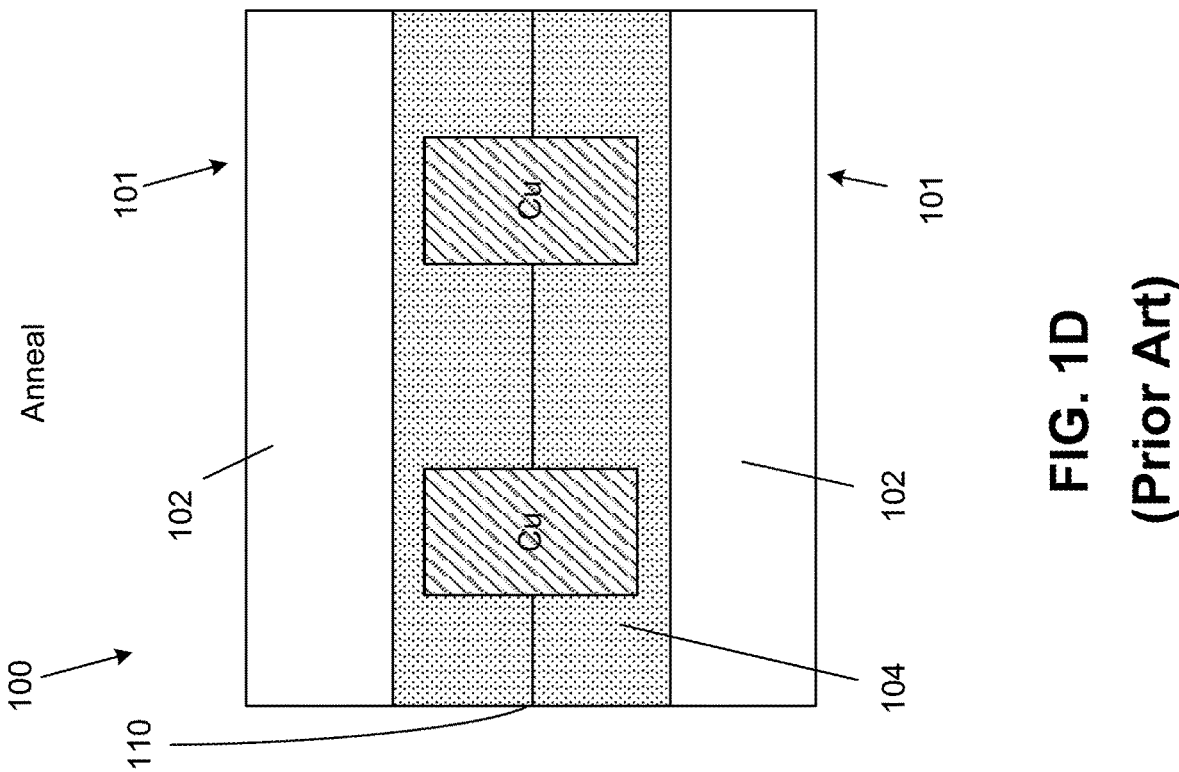

In the present implementations, the bonding process described in the method 30 does not include any surface treatment processes, such as the plasma treatment for activating the first bonding surface 214 and/or the second bonding surface 216 and the hydration process for enhancing the bonding capabilities of the first bonding surface 214 and/or the second bonding surface 216 as those depicted in FIGS. 1A and 1B, respectively. As will be described in detail below, the method 30 proceeds directly to applying a thermal treatment (e.g., an annealing process) to the coupled first bonding surface 214 and the second bonding surface 216, thereby causing the first bonding layer 209a to chemically react with the second bonding layer 209b to form non-reversible (or harder-to-reverse) covalent bonds in the composite bonding layer 304 (see FIG. 9) at the bonding interface 302.

Notably, omitting the surface treatment processes before aligning and contacting the first bonding surface 214 and the second bonding surface 216 reduces the number of modules (e.g., operations) performed on a bonding platform (e.g., reduces processing complexity, time, and/or cost) as well as the queue time requirement for fabrication. In existing implementations, the surface treatment processes generally result in reversible bonding between the bonding surfaces, which is relatively unstable and may pose processing constraints. Such processing constraints may include shortened processing time allowed between the surface treatment processes and the subsequent bonding processes, thereby imposing tighter queue time requirement.

In contrast, reacting the first bonding layer 209a with the second bonding layer 209b results in non-reversible covalent bonds in the composite bonding layer 304 with improved bonding strength across the bonding interface 302, thereby relaxing (e.g., minimizing or negating) the queue time requirement that is otherwise present for bonding surfaces undergone surface treatment. In addition, incorporating the first bonding layer 209a and the second bonding layer 209b at the first bonding surface 214 and the second bonding surface 216, respectively, allows more stable functional groups (e.g., the alkyne moiety 402 and the azide moiety 412) to participate in the bonding process and improves properties of the semiconductor structure 300 including, for example, resistance to metal (e.g., copper) diffusion, lowered processing temperature, tunable chain lengths and bonding interface thickness, and/or the like.

Referring to FIGS. 3 and 8B, the method 30 at operation 36 performs a thermal treatment (e.g., an annealing process) 80 to anneal the semiconductor structure 300, thereby allowing the first bonding surface 214 and the second bonding surface 216 to chemically react and form the composite bonding layer 304 at the bonding interface 302 according to a schematic reaction 400 depicted in FIG. 9.

Referring to FIG. 9, it is noted that figures of the first semiconductor structure 200 and the second semiconductor structure 250 each omit the depiction of the dielectric layer 204 and the conductive feature 206 for purposes of brevity. At operation 32, the first semiconductor structure 200 is provided to include the first bonding layer 209a having the alkyne moiety 402 coupled to the first base molecule R1 extending from the semiconductor substrate 202, and the second semiconductor structure 250 is provided to include the second bonding layer 209b having the azide moiety 412 coupled to the second base molecule R2 extending from the semiconductor substrate 202. After inverting one of the first semiconductor structure 200 and the second semiconductor structure 250, the alkyne moiety 402 is brought adjacent the azide moiety 412 at the bonding interface 302 at operation 34.

At operation 36, the thermal treatment 80 is implemented by applying sufficient thermal energy to activate the click chemistry, which couples the alkyne moiety 402 to the azide moiety 412 via the cycloaddition mechanism as shown. In some implementations, the cycloaddition mechanism is a 1,3 dipolar-cycloaddition mechanism that does not rely on the use of a copper catalyst. In the present implementations, reacting the alkyne moiety 402 with the azide moiety 412 forms a triazole moiety (or group) 422 including a ring structure, which covalently links (or crosslinks) the first bonding surface 214 with the second bonding surface 216 via the first base molecule R1 and the second base molecule R2, respectively. In this regard, the triazole moiety 422 serves as a bridge between the first semiconductor structure 200 and the second semiconductor structure 250.

In some examples, the thermal treatment 80 may be implemented at a temperature that is less than the temperature typically employed for coupling the dielectric layers 204 of the first bonding surface 214 and the second bonding surface 216, i.e., for coupling bonding surfaces not functionalized with groups such as alkyne and azide. In some implementations, the thermal treatment 80 provides sufficient thermal energy to also cause the conductive features 206 of the respective first bonding surface 214 and second bonding surface 216 to expand across the bonding interface 302, resulting in the metal-to-metal contact at the bonding interface 302.

The resulting composite bonding layer 304 is disposed at the bonding interface 302 and covalently bonded to the first bonding surface 214 via the first base molecule R1 and to the second bonding surface 216 via the second base molecule R2. If the thermal treatment 80 provides sufficient thermal energy to cause the expansion of the conductive features 206, the composite bonding layer 304 may extend along sidewalls of the bonded conductive features 206. In some implementations, a thickness T of the composite bonding layer 304 is at least a sum of the chain lengths of the first base molecule R1 and the second base molecule R2. In this regard, the present disclosure provides methods of tuning the thickness T by controlling the size (e.g., types of monomers, molecular weights, etc.) of the first base molecule R1 and/or the second base molecule R2. In some implementations, tuning the thickness T may improve properties of the composite bonding layer 304 including, for example, resistance to metal (e.g., copper) diffusion, lowered processing temperature, and/or the like.

In some implementations, an additional thermal treatment may be applied after forming the composite bonding layer 304 to expand the conductive features 206 across the bonding interface 302. In this regard, the temperature at which the additional thermal treatment is applied is greater than the temperature applied for the thermal treatment 80 at operation 36, such as at about 250° C. to about 400° C. In some implementations, the thermal treatment 80 may be applied at a temperature allowing both the schematic reaction 400 and the expansion of the conductive feature 206 to occur concurrently.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
   providing a first substrate with a first surface including an alkyne moiety, wherein the provision of the first substrate comprises applying a first self-assembled monolayer (SAM) over the first surface, the first SAM having the alkyne moiety extending from the first surface;
   providing a second substrate with a second surface including an azide moiety, wherein the provision of the second substrate comprises applying a second SAM over the second surface, the second SAM having the azide moiety extending from the second surface; and
   bonding the first substrate to the second substrate, including making physical contact between the first surface and the second surface at an interface and chemically reacting the alkyne moiety with the azide moiety through a cycloaddition mechanism, thereby forming a triazole moiety-linked layer at the interface,
   wherein applying the first SAM and the second SAM include depositing each of the first SAM and the second SAM as a blanket layer and removing portions of the first SAM and the second SAM.

2. The method of claim 1, wherein the alkyne moiety is coupled to the first substrate via a first base molecule and the azide moiety is coupled to the second substrate via a second base molecule.

3. The method of claim 1, wherein applying the first SAM and the second SAM each include implementing a selective deposition process.

4. The method of claim 3, wherein providing the first substrate further includes functionalizing the first surface before applying the first SAM and providing the second substrate further includes functionalizing the second surface before applying the second SAM.

5. The method of claim 1, wherein the first surface includes a first conductive feature disposed in a first dielectric layer and the second surface includes a second conductive feature disposed in a second dielectric layer, and wherein the first SAM and the second SAM are selectively formed over the first dielectric layer and the second dielectric layer, respectively.

6. The method of claim 1, wherein bonding the first substrate to the second substrate includes applying a thermal treatment to activate the cycloaddition mechanism.

7. The method of claim 6, wherein the thermal treatment is implemented at a temperature less than a temperature for forming the first SAM over a first dielectric layer comprising a first conductive feature of the first surface.

8. A method, comprising:
   providing a first substrate with a first bonding surface including a first self-assembled monolayer (SAM) having an alkyne group;
   providing a second substrate with a second bonding surface including an azide group;
   bonding the first substrate to the second substrate by making physical contact between the first bonding surface and second bonding surface; and
   performing a thermal treatment implemented at a temperature less than a temperature for depositing the first SAM over the first bonding surface, thereby allowing a cycloaddition process to occur between the bonded first bonding surface and second bonding surface.

9. The method of claim 8, wherein bonding the first substrate to the second substrate includes aligning the first bonding surface with the second bonding surface.

10. The method of claim 8, wherein the alkyne group is linked to the first substrate by a first base molecule and the azide group is linked to the second substrate by a second base molecule.

11. The method of claim 8, wherein providing the first substrate includes forming a first self-assembled monolayer (SAM) over the first bonding surface, the first SAM including the alkyne group, and providing the second substrate includes forming a second SAM over the second bonding surface, the second SAM including the azide group.

12. The method of claim 11, wherein forming the first SAM includes selectively depositing the first SAM over the first bonding surface and forming the second SAM includes selectively depositing the second SAM over the second bonding surface.

13. The method of claim 8, wherein performing the thermal treatment causes the alkyne group to covalently bond with the azide group via the cycloaddition process, thereby forming a triazole group in a composite bonding layer.

14. A semiconductor structure, comprising:
   a first substrate;
   a second substrate; and
   a composite bonding layer covalently coupled to the first substrate and the second substrate, the composite bonding layer including a triazole moiety,
   wherein the first substrate includes a first conductive feature disposed in a first dielectric layer and the second substrate includes a second conductive feature disposed in a second dielectric layer, and wherein the composite bonding layer extends between the first dielectric layer and the second dielectric layer.

15. The semiconductor structure of claim 14, wherein the composite bonding layer is covalently coupled to a first surface of the first substrate via a first base molecule and to a second surface of the second substrate via a second base molecule.

16. The semiconductor structure of claim 14, wherein the composite bonding layer extends to contact a sidewall of each of the first conductive feature and the second conductive feature.

\* \* \* \* \*